United States Patent [19]

Rudy, Jr. et al.

[11] Patent Number: 5,343,361
[45] Date of Patent: Aug. 30, 1994

[54] THERMAL JUNCTION FOR CARD EDGES IN A CARD CAGE AND GROUND CLIP THEREFOR

[75] Inventors: William J. Rudy, Jr., Annville; Howard R. Shaffer, Millersburg; Daniel E. Stahl, Hummelstown, all of Pa.

[73] Assignee: The Whitaker Corporation, Wilmington, Del.

[21] Appl. No.: 76,614

[22] Filed: Jun. 11, 1993

[51] Int. Cl.⁵ .......................... H05K 7/20; H05K 9/00
[52] U.S. Cl. .................... 361/710; 174/35 R; 174/51; 361/725; 361/753; 361/799; 361/800; 361/816
[58] Field of Search ............. 174/35 R, 35 C, 51; 361/644, 676, 678, 690, 704, 710–711, 725, 753, 796, 797, 799, 800, 816, 818, 831; 439/61, 64, 108, 485, 607, 609

[56] References Cited

U.S. PATENT DOCUMENTS

| 2,844,644 | 7/1958 | Soule, Jr. ................ 174/35 R |
| 4,735,583 | 4/1988 | Rudy, Jr. et al. ............. 439/350 |
| 4,808,115 | 2/1989 | Norton et al. ............... 439/79 |
| 4,833,569 | 5/1989 | Prubst ...................... 361/388 |
| 4,836,789 | 6/1989 | Rudy, Jr. et al. ............. 439/64 |
| 4,846,699 | 7/1989 | Glover et al. ............... 439/64 |
| 4,938,702 | 7/1990 | English .................... 439/67 |
| 4,995,821 | 2/1991 | Casey ..................... 439/157 |
| 5,166,862 | 11/1992 | Durivage, III et al. ........ 361/388 |
| 5,235,492 | 8/1993 | Humbert et al. ............. 361/818 |

OTHER PUBLICATIONS

Calmark Catalog, "Series 225-Card-Lok Retainer (Cold Plate)"; p. 12; Calmark Corporation, San Gabriel, Calif. (Date unknown).

Primary Examiner—Gregory D. Thompson
Attorney, Agent, or Firm—Anton P. Ness

[57] ABSTRACT

A thermal junction (64) with an edge (106) of a daughter card (100) in a card cage enclosure (10). A front panel (50) of the enclosure includes an array of interior fins (58) extending to edges (60) adjacent the edges (106) of the array of daughter cards (100). Spring clips (62) mounted along the fin edges engage the card edges simultaneously upon the front panel (50) being placed in position, and spring arms (70) of each clip establish a plurality of assured thermal connections of the card edges with the fins, for the front panel (50) to dissipate heat from the circuit cards (100) to the exterior of the enclosure (10). With cards having a metal shielding layer (110), the spring clips (62) also define a ground to the enclosure wall.

16 Claims, 12 Drawing Sheets

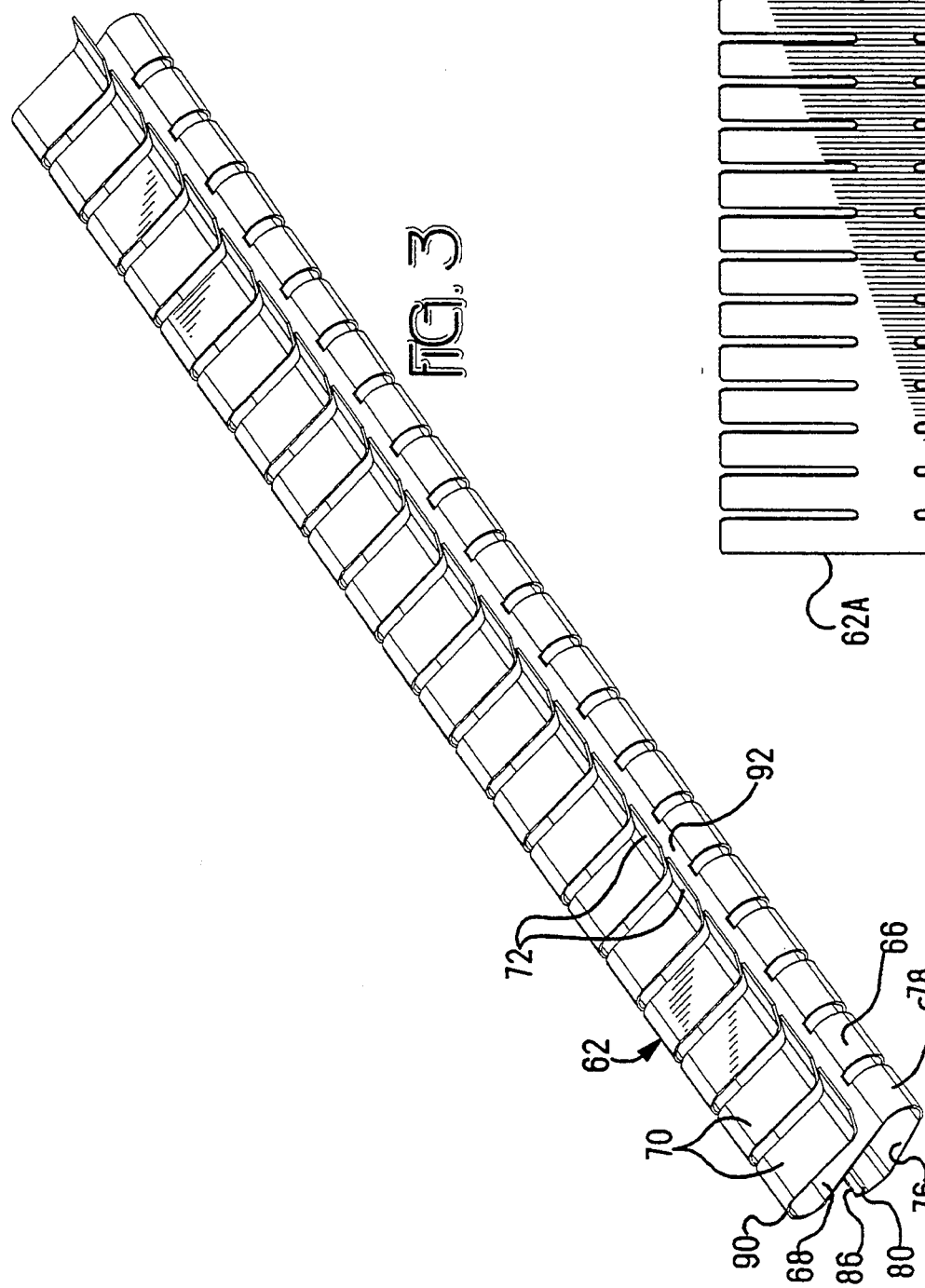

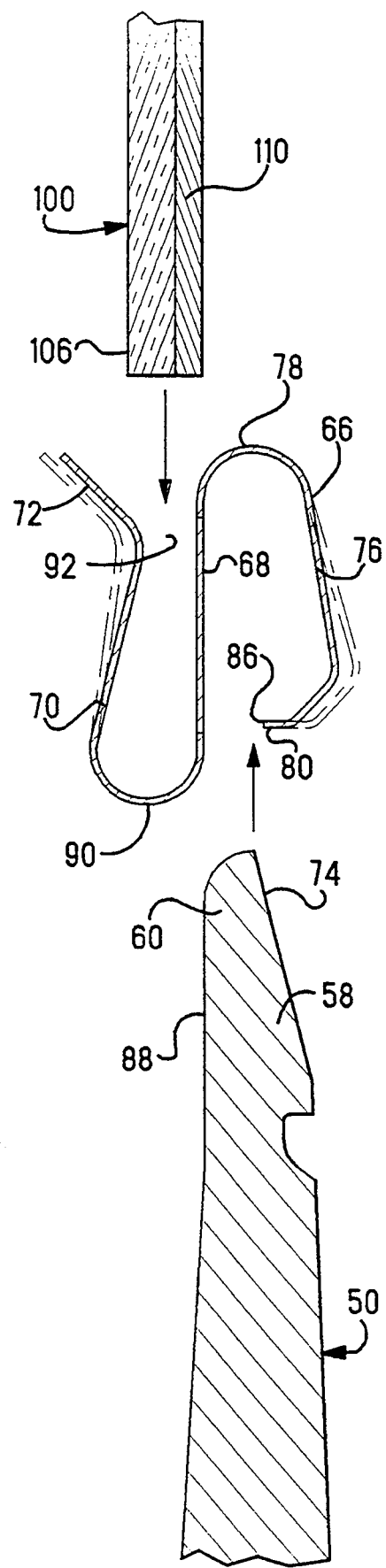
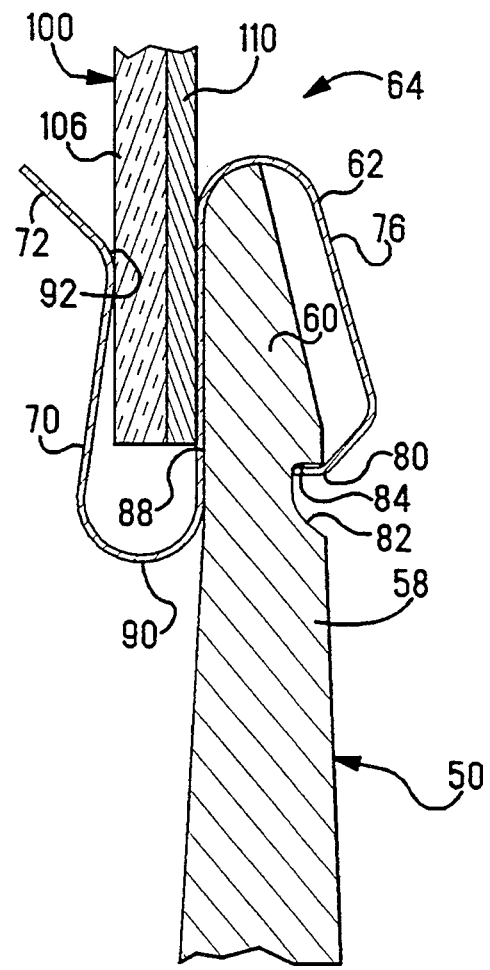
FIG. 5
FIG. 6

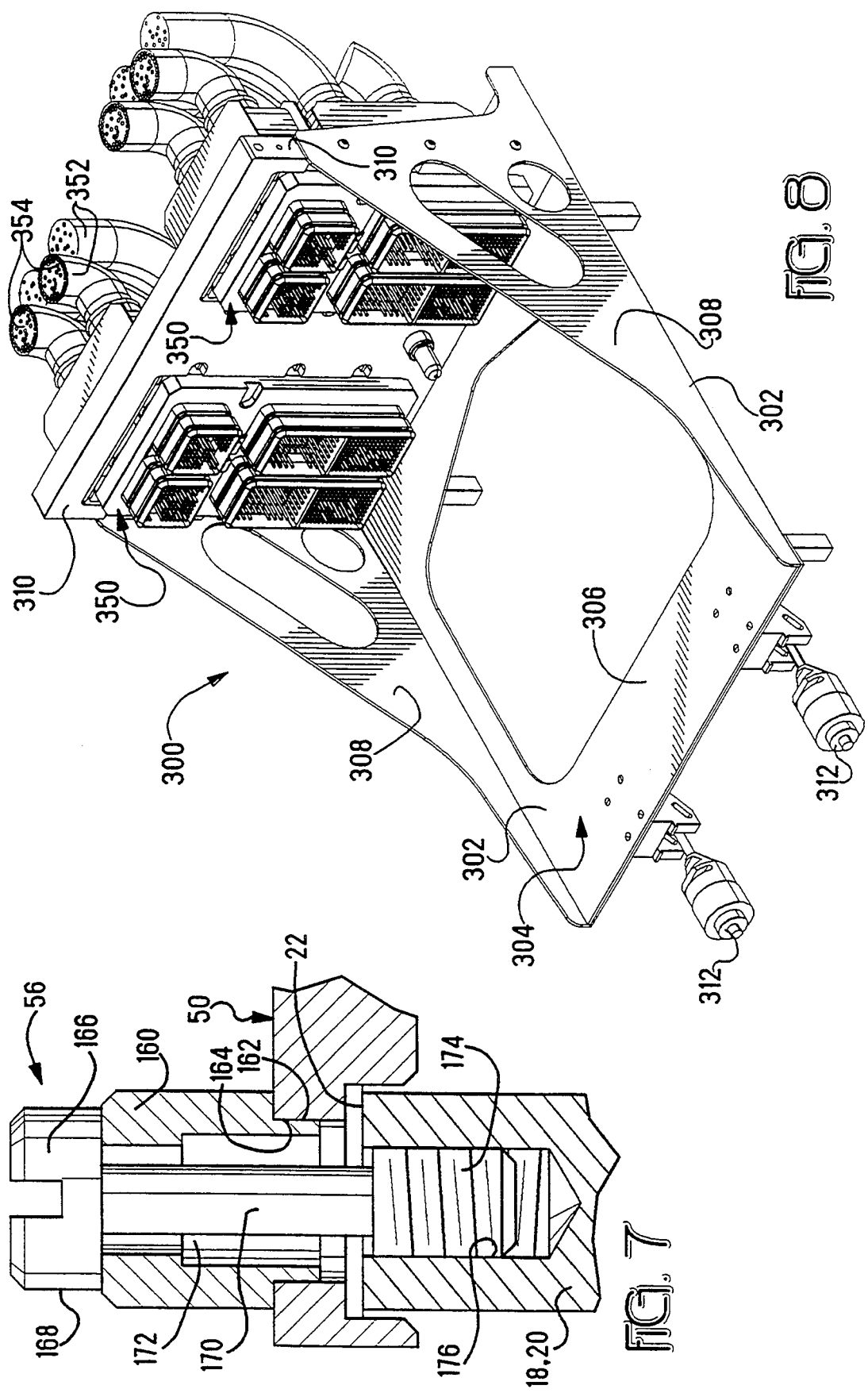

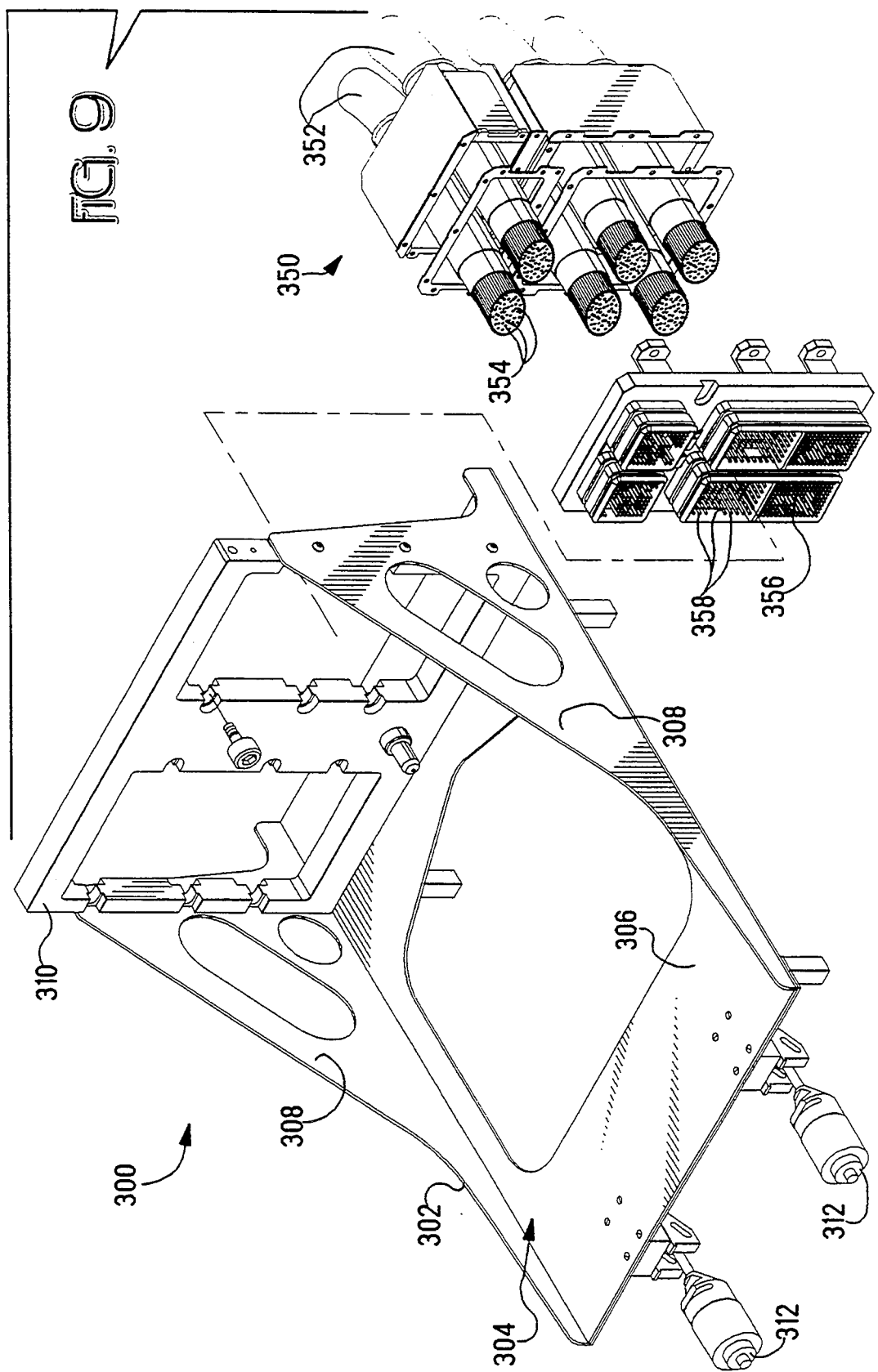

1

THERMAL JUNCTION FOR CARD EDGES IN A CARD CAGE AND GROUND CLIP THEREFOR

FIELD OF THE INVENTION

The present invention relates to daughter card/mother board arrays and more particularly to dissipation of thermal energy therefrom.

BACKGROUND OF THE INVENTION

High density interconnection or wire integration systems are known in which a framework is provided which enables mounting thereto of arrays of electrical connectors terminated to multiconductor cables, such as are disclosed in U.S. Pat. No. 4,735,583 and in U.S. Pat. No. 4,995,821. Such arrays of connectors are generally open to the flow of ambient air which serves to dissipate heat therefrom.

Card cages such as is disclosed in U.S. Pat. No. 4,846,699 are known in which an array of daughter cards are inserted into appropriate locations of a framework to be mated with a backplane. In one particular form of card cage disclosed in U.S. Pat. No. 4,808,115, an enclosure similar to a black box contains a mother board, and circuit cards contained within line replaceable modules are inserted into the enclosure to be mated with the mother board. In U.S. Pat. No. 4,836,789 a similar black box is disclosed, in which pairs of track members are positioned at the module locations and serve to guide the modules to be mated to the mother board; the disclosure refers to adaptations directed to the dissipation of thermal energy by circulating fluid through the track members.

It is desired to provide for dissipation of thermal energy in a card cage.

It is also desired to provide for dissipation of thermal energy from a card cage which is in compact form and completely enclosed to shield the daughter cards and backplane assembly from electromagnetic and radiofrequency interference.

SUMMARY OF THE INVENTIONS

The present invention is for use in an enclosure for an array of individual circuit boards or daughter cards and a backplane assembly to which the circuit boards are electrically connectable and disconnectable, defining a card cage. A front panel traversing the front of the enclosure includes at least an array of interior fins associated with and adjacent each daughter card, with a spring clip joining a card-proximate end of each fin with a trailing edge of each daughter card to define a thermal junction upon securing the front panel in place. The front panel is securable to and removable from the enclosure while simultaneously either engaging or releasing the circuit card edges, thus enabling insertion and removal of individual daughter cards from the enclosure as desired and reestablishing the thermal junctions. Preferably the front panel also includes an array of fins along the exterior surface for dissipating thermal energy transmitted from the interior during in-service use, by increasing the surface area exposed to ambient air currents surrounding the junction box.

The spring clips may be preferably mounted along the card-proximate ends of each fin to become firmly engaged by means of a spring arm, with the adjacent edge of the associated daughter card to establish a ground connection and a thermal connection with an electrically and thermally conductive layer of the daughter card to establish an enhanced heat-removal mechanism, as well as a means for minimizing crosstalk between components of the various daughter cards. Such spring clips mounted along the interior fins are adapted to mate simultaneously with the front edges of all the respective daughter cards in a blind mate manner.

When used with circuit cards having a metal layer for optimized thermal conductivity to the card's edge, the spring clips are preferably electrically conductive and serve to establish an assured ground of the metal layers to the conductive enclosure, facilitating the performance of the metal layers in minimizing crosstalk between the components of the various cards.

The enclosure, or junction box, defines an integral rugged electrically and thermally conductive envelope surrounding the backplane assembly and daughter cards which provides protection against electromagnetic interference (EMI) and radiofrequency interference (RFI) to assure the integrity of signals received, processed and transmitted by the electronic circuitry and components therewithin. The junction box also provides heat dissipation for the components therewithin which have been isolated from the otherwise cooling effect of ambient air flow usually relied upon to remove thermal energy from electronics bays and may be mountable to a shelf or other frame structure as is conventional, in a manner similar to that used for securing black boxes in electronics bays of aircraft, and using a rack similar to conventional racks.

It is an objective of the present invention to provide a thermal junction with each daughter card of a card cage.

It is an additional objective to provide an arrangement for establishing and separating junctions with all daughter cards simultaneously.

An embodiment of the present invention will now be described by way of example with reference to the accompanying drawings.

BRIEF DESCRIPTION OF THE DRAWINGS

FIGS. 3 and 4 are an isometric view of a spring clip of the present invention for establishing thermal junctions of the present invention of daughter cards with the junction box, and a plan view of a blank for the spring clip;

FIGS. 5 and 6 are enlarged part section views of the thermal junction of a daughter card and the junction box, being assembled and fully defined, respectively;

FIG. 7 is an enlarged part section view of a fastener for use in securing the front panel to the junction box of FIGS. 1 and 2;

FIGS. 8 and 9 are isometric views of the rack assembly of FIG. 1, assembled and exploded respectively, showing the cable connectors mounted therein at the input/output interface of the junction box and the rack assembly;

DETAILED DESCRIPTION OF THE PREFERRED EMBODIMENT

Figure 1:
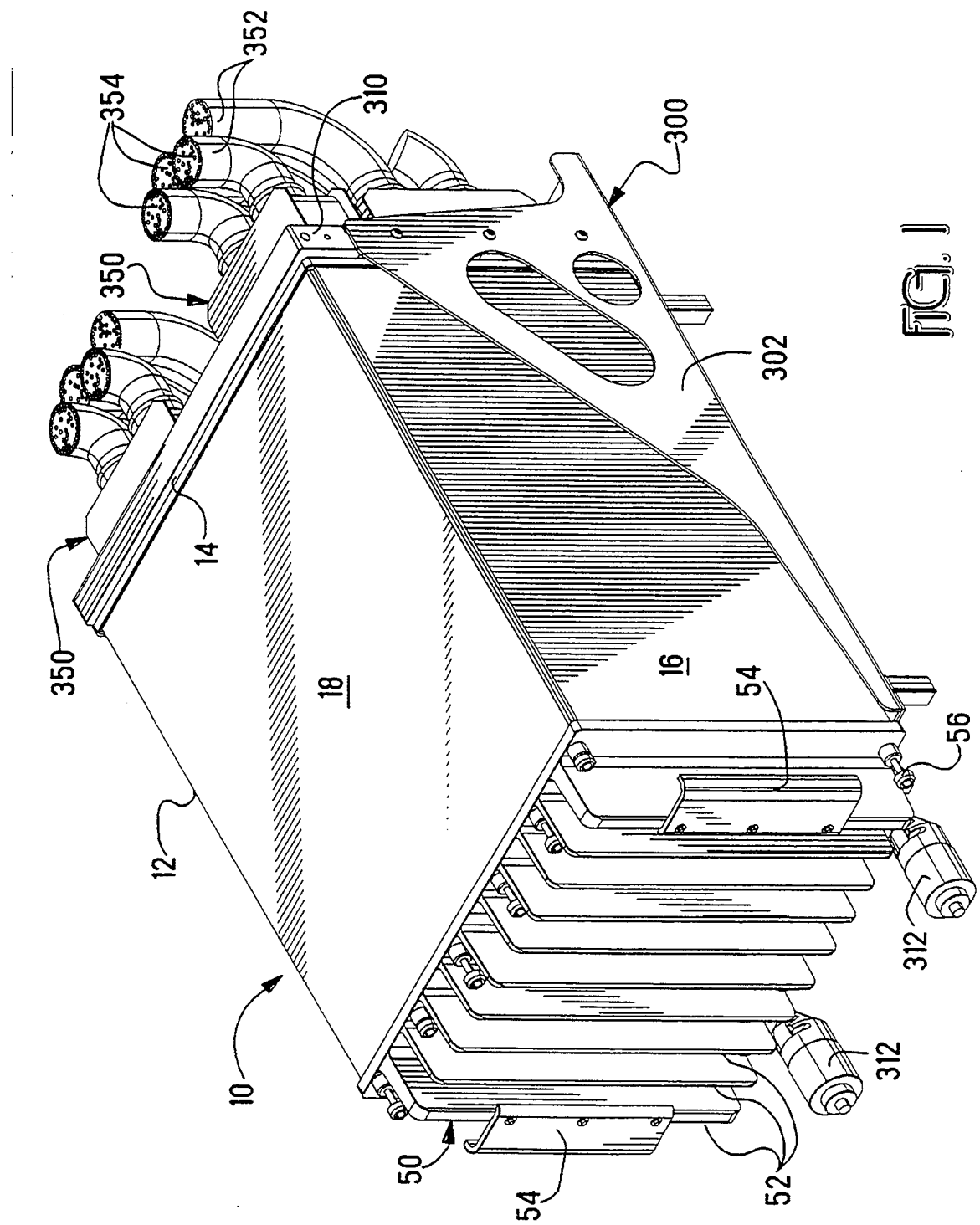
FIGS. 1 and 2 are an isometric view and exploded isometric view of a junction box secured in position within a rack assembly.
Figure 2:
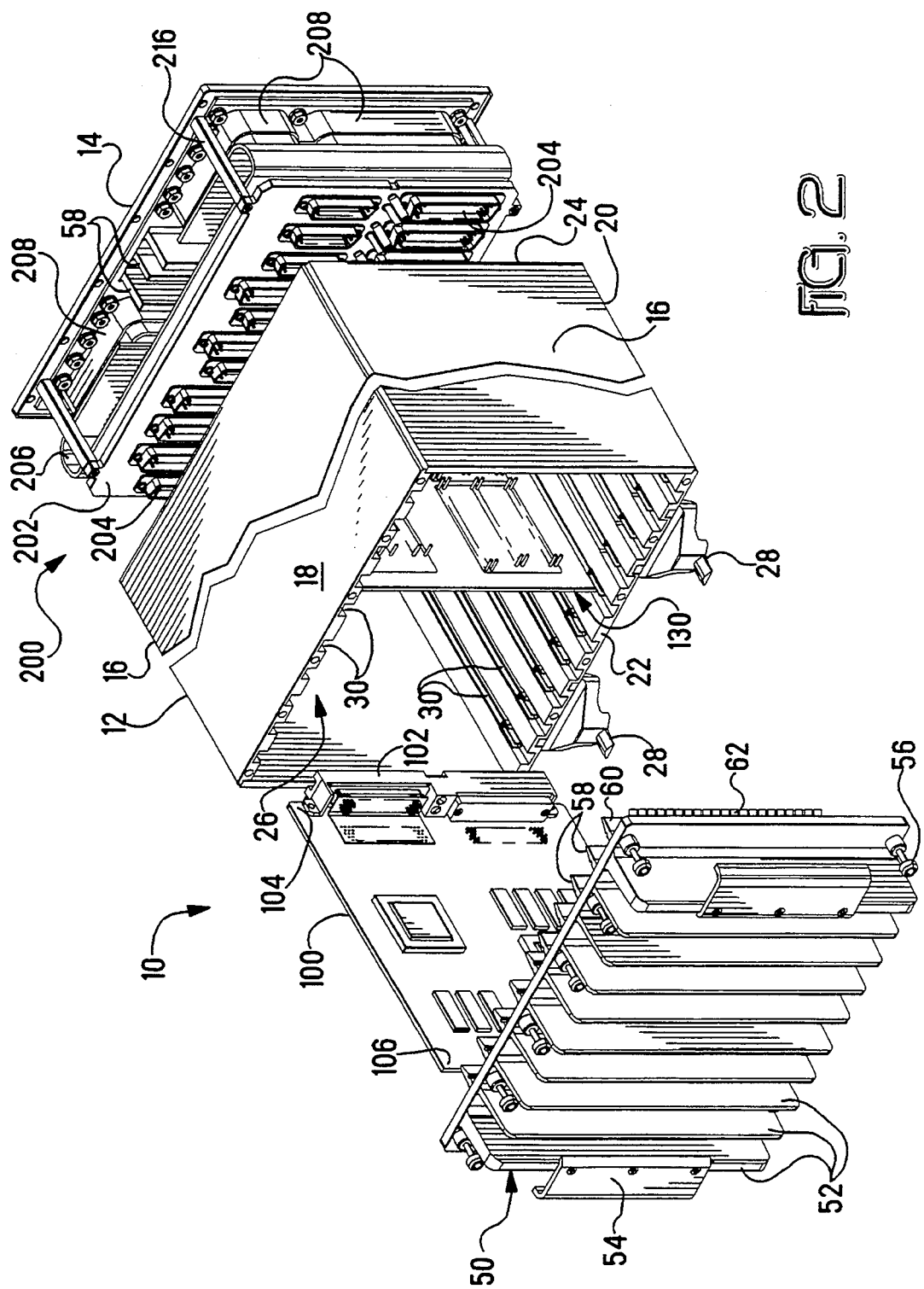
Figure 10:
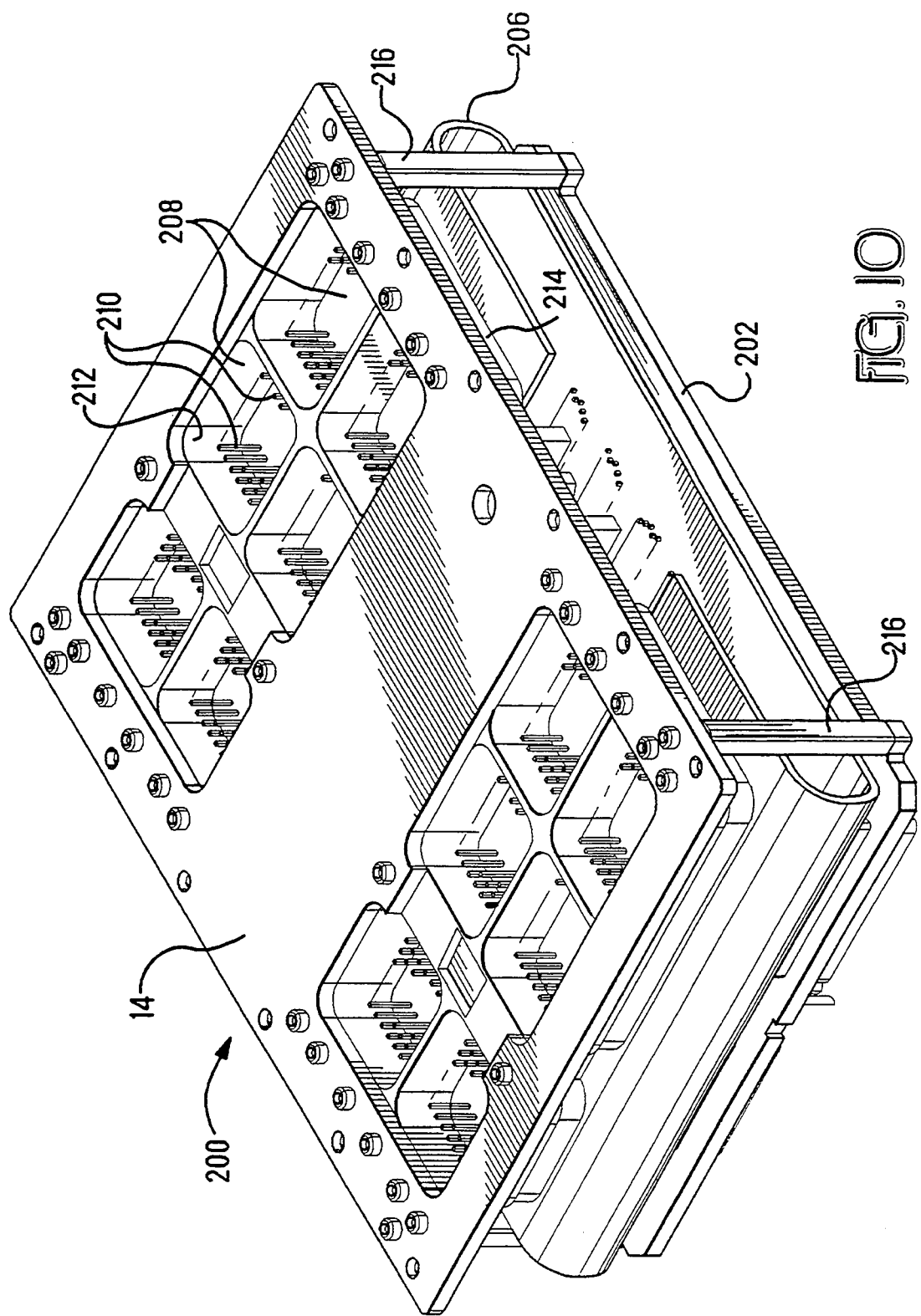
FIG. 10 is an isometric view of the rear wall of the junction box, which is part of the backplane assembly for the junction box, showing the input/output connectors thereof at the input/output interface.
Figure 13:
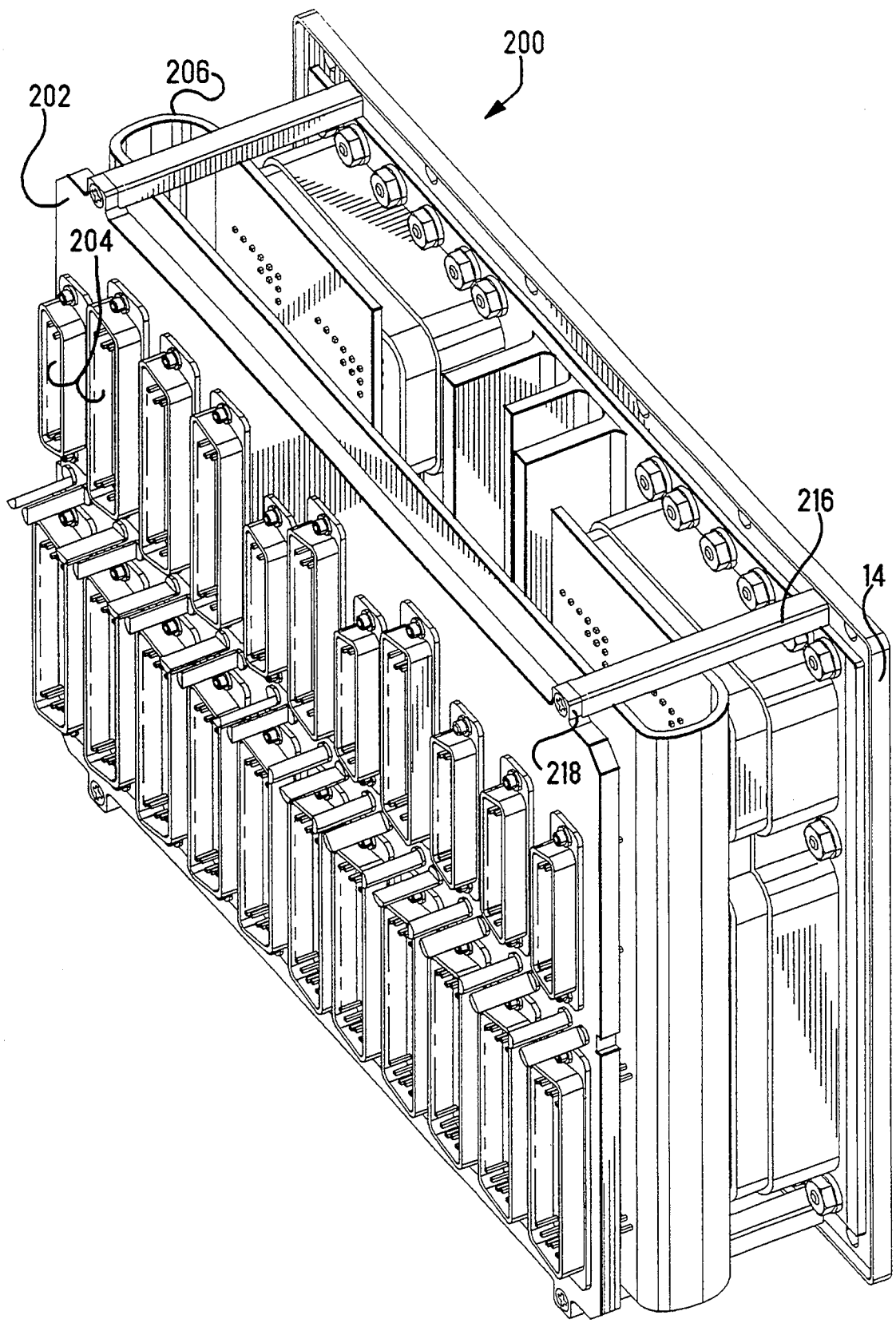
FIG. 13 is an isometric view of the backplane assembly showing the daughter card interface thereof within the junction box.

Junction box 10 of FIGS. 1 and 2 includes a box-like body section 12, front panel 50 and rear wall 14 with body section 12 having opposing side walls 16 and top wall 18 and bottom wall 20 and extends from front face 22 to rear face 24 defining a card-receiving region 26 extending inwardly from front face 22. Front panel 50 includes an array of exterior fins 52, to two of which are mounted a pair of handles 54 enabling manual gripping of the front panel for handling during removal from junction box 10, and is mountable to front face 22 using fasteners 56 secured about the periphery threaded into forward edges of the top and bottom walls 18,20. Junction box 10 is preferably used in conjunction with a rack assembly such as is shown in FIGS. 8 and 9 to which are secured cable-terminated connectors 350, with junction box 10 including a backplane assembly 200 such as shown in FIGS. 10 and 13 for interconnecting the cable's conductors 354 with circuits of an array of daughter cards 100 in the junction box. Junction box 10 is disclosed in greater detail in U.S. patent application Ser. No. 08/076,654 filed Jun. 11, 1993 and assigned to the assignee hereof.

In FIG. 1 junction box 10 is shown in position mounted within tray section 302 of rack assembly 300 for in-service use, with rack assembly 300 mounted on a shelf (not shown) within a structure such as an aircraft or ship. Junction box 10 is slidable along a box-receiving path 304 defined by bottom wall 306 and side walls 308, and is shown abutting panel member 310 traversing the end of box-receiving path 304. Panel member 310 is a rugged frame firmly affixed to tray section 302, and includes mounted thereto several electrical connectors 350 terminating a plurality of cables 352 containing multiple electrical conductors 354. Junction box 10 is locked in position using locking hardware 312 at the forward end of tray section 302, engaging locking embossments 28 depending from junction box 10 proximate front face 22 (FIG. 2).

Junction box 10 is shown in greater detail in FIG. 2, with card-receiving region 26 including opposing pairs of card guide channels 30 extending inwardly from front face 22 to define guides for insertion of circuit cards such as daughter card 100 and matrix card 130. Thus the junction box is essentially a compact, fully enclosed card cage. Backplane assembly 200 is provided proximate rear face 24 and includes a forward wall section 202 traversing the inwardmost extent of card-receiving region 26. Mounted onto forward wall section 202 is an array of card-associated electrical connectors 204 matable with complementary connectors 102 affixed to leading edges 104,134 of daughter cards 100 and matrix card 130 (see FIG. 15). Backplane assembly 200 further includes interconnection circuitry 206 extending from forward wall section 202 to rearward wall section 14, which may comprise the rear wall of junction box 10 as shown if desired. Rear wall 14 includes mounted thereon an array of electrical input/output connectors 208 corresponding to connectors 350 mounted on frame member 310 of rack assembly 300. Preferably rear wall 14 is joined to forward wall section 202 by a plurality of struts 216 peripherally of interconnection circuitry 206, so that backplane assembly 200 is manipulatable as a unit or subassembly insertable into body section 12 of junction box 10 at rear face 24 whereafter rear wall 14 is fastenable to rear edges of side walls 16 and top and bottom walls 18,20 thereof.

Junction box 10 defines an integral rugged electrically conductive envelope surrounding the backplane assembly and daughter cards which provides protection against electromagnetic and radiofrequency interference to assure the integrity of signals received, processed and transmitted by the electronic circuitry and components therewithin. The junction box also provides heat dissipation for the components and interconnections therewithin which have become isolated from the otherwise cooling effect of ambient air flow usually relied upon to remove thermal energy from electronics bays. Side walls 16, top and bottom walls 18,20, rear wall 14 and front panel 50 are preferably formed of an electrically conductive alloy with superior thermal conductivity such as aluminum Alloy No. 6061 suitable for welding. Further preferably, all seams between the wall members of the junction box are tight fitting with resilient EMI gaskets used where necessary such as the mounting interface of the front panel with the front face, and at the openings in rear wall 14 for input/output connectors 208, thus eliminating all gaps which otherwise could permit EMI/RFI leakage into and out of the junction box.

The junction box thus provides a compact card cage of robust construction adapted to shield circuit cards and interconnections of circuits thereof with input/output conductors. With use of matrix card 130 or similar element the junction box has a circuit integration capability enabling simplification of the backplane assembly to become compact for a high population of circuit interconnections.

Embossments 28 are seen depending from bottom wall 20 at the front edge thereof, and are designed to be engaged by locking hardware 312 of rack assembly 300 when junction box 10 is inserted fully into rack assembly 300. By being affixed to bottom wall 20, locking hardware 312 and embossments 28 continue holding junction box 10 in its locked in-service position mated to panel member 310 of rack assembly 300 at the input/output interface even when front panel 50 is removed from front face 22; the arrangement permits opening the junction box for insertion or removal of a particular daughter card while permitting all other daughter cards to remain in position with their circuits fully connected through the backplane assembly to the input/output conductors at the input/output interface at rear wall 14 and panel member 310 of rack assembly 300. Such capability greatly minimizes down time of an aircraft in which the junction box is mounted by rendering moot the necessity for retesting of the circuits and functions of the daughter cards not disconnected.

Further seen in FIG. 2, front panel 50 includes an array of interior fins 58 associated with respective daughter cards 100 and extending to card-proximate ends 60 on which are mounted spring clips 62. Spring clips 62 are adapted to capture trailing ends 106 of all daughter cards simultaneously upon mounting of front panel 50 in place across front face 22 in a manner permitting simultaneous disengagement, to engage trailing ends 106 at pluralities of locations to establish thermal junctions 64 therewith (FIG. 6). Thermal junctions 64 transfer heat from the daughter cards to the interior fins, and front panel 50 dissipates the heat from the daughter cards and interior of the junction box, especially through exterior fins 52. Rear wall 14 also is shown to have interior fins 58 which likewise provide heat dissipation benefits.

In FIG. 3 is shown a spring clip 62 of the present invention mountable to card-proximate ends 60 of interior fins 58 of front panel member 50 of junction box 10, with spring clip 62 formed from a blank 62A as shown in FIG. 4, and with FIGS. 5 and 6 illustrating spring clip 62 mounted to a fin and establishing a thermal junction 64 with a daughter card trailing edge 106. Such spring clips mounted along the interior fins are adapted to mate simultaneously with the front edges of all the respective daughter cards in a blind mate manner. Preferably spring clips 62 are formed of metal stock such as beryllium copper Alloy No. 25, full hard temper, and be sufficiently thick to possess strong spring properties, such as 0.010 inches. Spring clips may also be affixed to the trailing edge of the circuit card and be blindmatable with card-proximate ends of the interior fins.

Each spring clip 62 includes a mounting section 66, body section 68 extending therefrom, and an array of spring arms 70 extending from body section 68 to respective free ends 72. Preferably mounting section 66 is adapted to be joined to a card-remote portion of a respective fin 58, such as surface 74 facing away from the associated circuit card trailing edge 106. Mounting section 66 can comprise an array of spring arms 76 extending from bight sections 78 joined to body section 68 around fin end 60 and along card-remote surface 74 to free ends 80. Each free end 80 comprises a short section extending perpendicularly to card-remote surface 74 of fin 58 to be received into recess 82 thereof defining a locking surface 84. Mounting spring arms 76 are so formed at bight sections 78 and have free ends 80 extending to an edge 86 so positioned a short distance from body section 68 in the unstressed state compared to the thickness of interior fin 58 at recess 82, that free ends 80 are held therein by strong clamping spring bias able to resist being pulled off card-proximate fin ends 60 during front panel removal.

Body section 68 is integral and elongate to extend along most of trailing edge 106 of a daughter card 100, and extends from mounting section 66 and along a card-proximate surface 88 of fin 58 to be parallel and adjacent to a trailing edge portion 106 of daughter card 100. A spring arm section is adjoined to body section 68, such as an array of discrete spring arms 70 joined at respective bight sections 90 positioned forwardly of trailing edge 106 upon full assembly of the circuit card in the junction box and placement of front panel 50 along front face 22. Each spring arm 70 extends to a constriction 92 and concludes at a free end section 72 diverging from body section 68 at card-proximate fin end 60 and defining an edge-receiving entrance. Constriction 92 is dimensioned less than the thickness of a daughter card 100, and upon entry of the trailing card edge thereinto spring arms 70 are deflected outwardly and thereafter assuredly urge trailing edge portions 106 inwardly against body section 68 of a respective spring clip 62 at a plurality of locations along trailing edge 106 establishing an array of thermal junctions therewith.

Each elongate spring clip 62 with opposed arrays of spring arms 70,76 of such serpentine cross-section can be made using a blank 62A as shown in FIG. 4, by using for example a plurality of sets of elongate dies in a press apparatus (not shown) in a progression of forming steps and preferably a progression of such steps for particular ones of the bight sections to consistently and carefully attain the desired bight radii and resultant dimensions at constrictions 92 and mounting free ends 80 in the unstressed state.

When used with circuit cards 100 having a metal layer 110 for optimized thermal conductivity to the card's edge, the spring clips are preferably electrically conductive and serve to establish an assured ground of the metal layers to the conductive enclosure, facilitating the performance of the metal layers in minimizing crosstalk between the components of the various cards.

FIG. 7 is an enlarged section view of a fastener assembly 56 of the type especially useful in mounting front panel 50 to front face 22 of junction box 10. Such fastener assembly 56 is conventional and one example is a captive panel screw available from Amatom, Inc. under Part Nos. 6766-SS-0832 and 6254B-SS-1032. Housing 160 includes an axially extending flange 162 pressfit into a large-diameter aperture 164 into front panel 50. Tool-engageable head 166 of screw member 168 is exposed outwardly of housing 160; elongate small diameter shank 170 extends through cavity 172 of housing 160 to large diameter threaded end portion 174 threadable into correspondingly threaded aperture 176 in forward edges of top and bottom walls 18,20 of body section 12 of junction box 10. Upon screw member 168 being rotated to unthread end portion 174 from aperture 176, larger-diameter threaded end portion 174 is received into housing cavity 172 which maintains it captive in the fully unthreaded state. With such fasteners, no loose parts exist needing to be specially handled especially during rethreading, or possibly to become lost during the process of removing and replacing front panel 50 from front face 22 of junction box 10.

Rack assembly 300 is shown in FIGS. 8 and 9, and is of the type disclosed in U.S. patent application Ser. No. 08/076,655 filed Jun. 11, 1993 and assigned to the assignee hereof. Bottom wall 306 and side walls 308 define a box-receiving path 304 extending to frame member 310, so that cable connectors 350 mounted thereon are positioned to become mated with corresponding input/output connectors 208 of the rear wall of the junction box when junction box 10 is fully installed by being moved along box-receiving path 304. The arrangement permits all cables 352 to be installed as complete cable harnesses into an aircraft (along with rack assembly) separate in time from installation of the junction box, and permitting automatic mating of the connectors merely upon junction box being installed.

Figure 11:
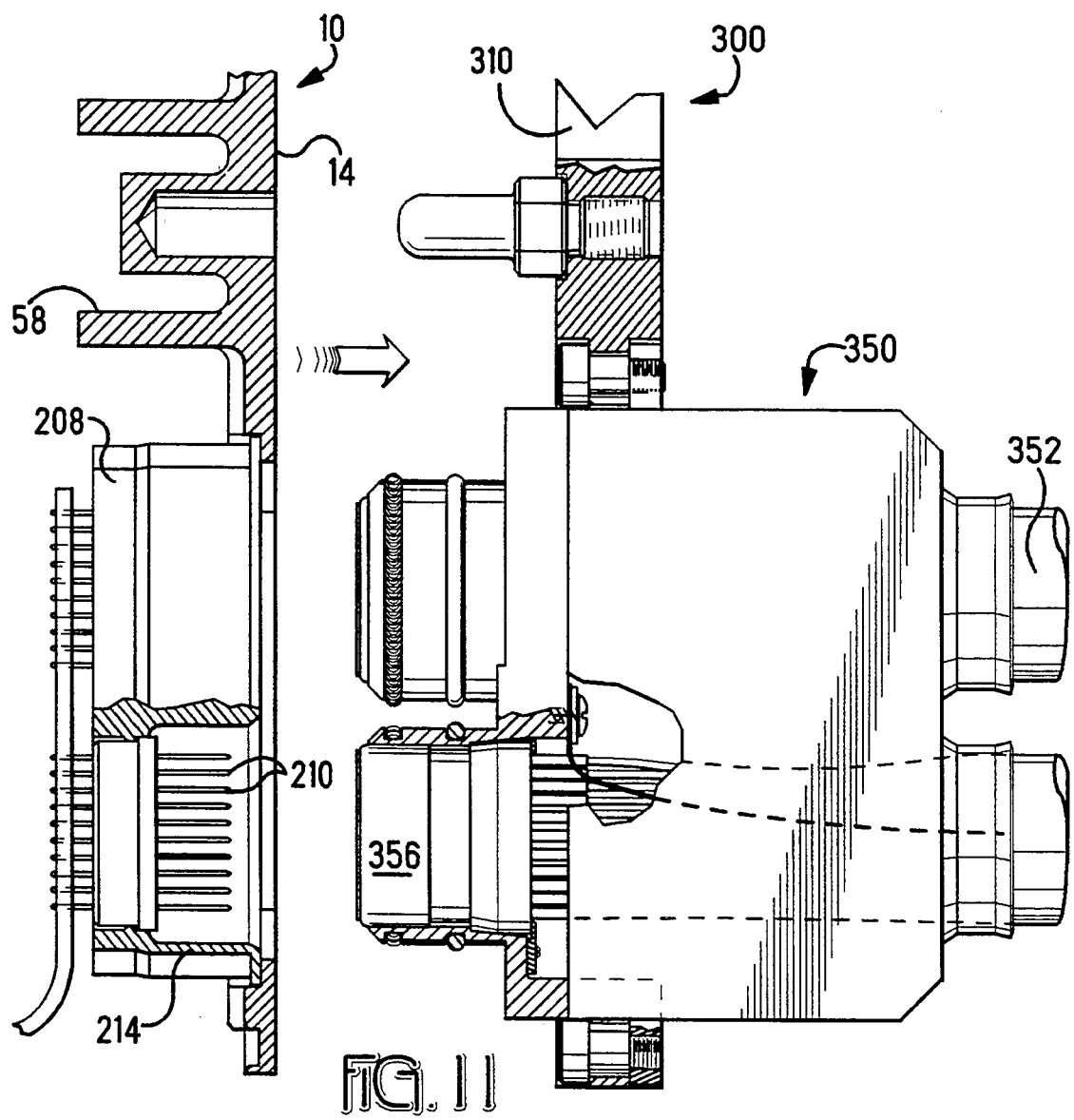
FIGS. 11 and 12 are part plan views and elevation views in cross-section of the input/output interface between the junction box and rack assembly of FIGS. 1 to 10.
Figure 12:
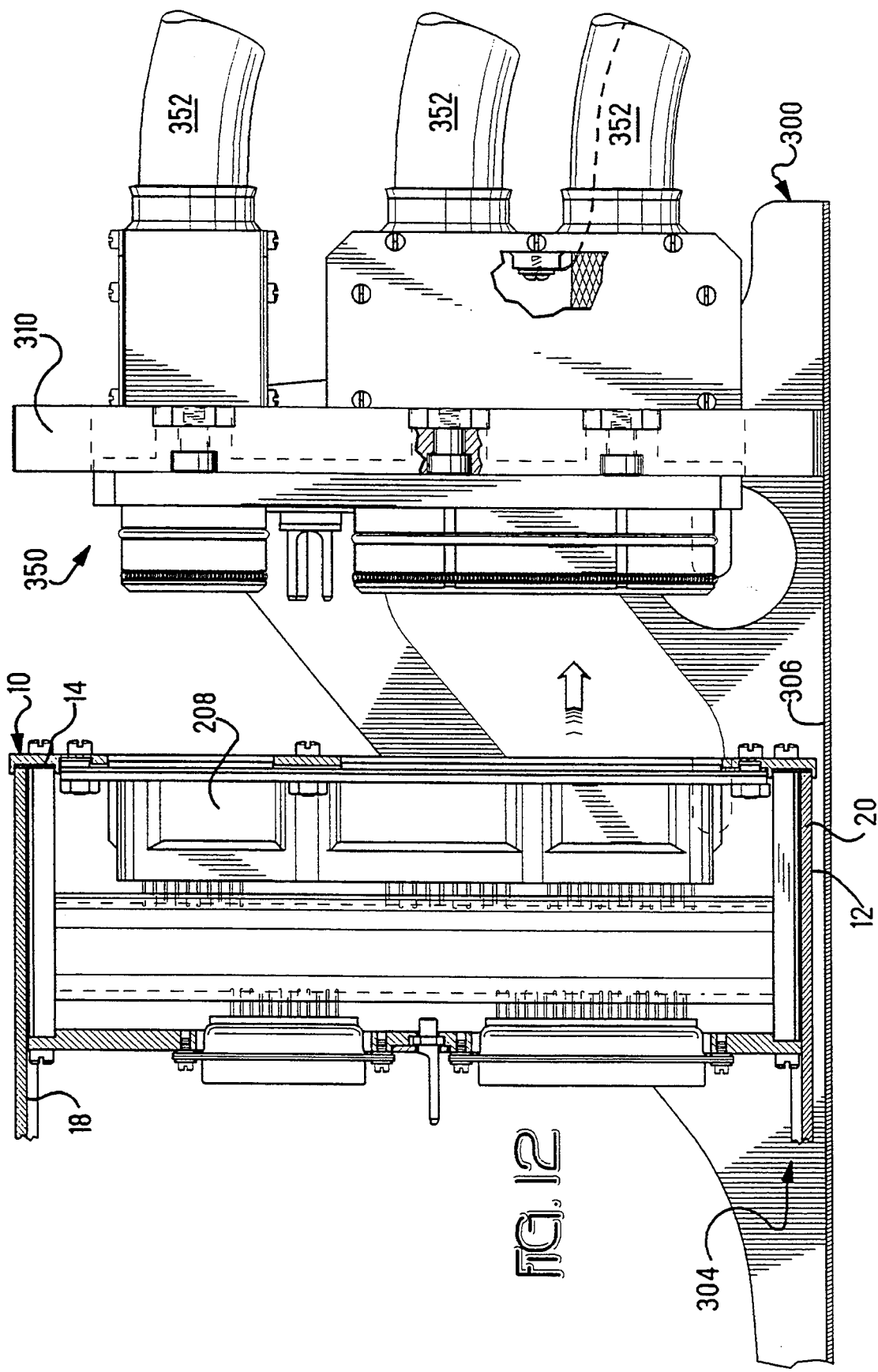

Rear wall 14 of junction box 10 shown in FIG. 10, which is shown to be a portion of backplane assembly 200, to contain an array of input/output connectors 208 having shield sections 214 defining receptacle sections 212 mounted therealong, simultaneously matable with cable connectors 350 on frame member 310, as illustrated in FIGS. 11 and 12. Cable connectors 350 include dielectric housings 356 containing discrete terminals terminated to conductors 354 of the cables with contact sections 358 exposed at mating faces thereof.

Backplane assembly 200 for junction box 10 is illustrated more clearly in FIGS. 10 and 13 and is disclosed in U.S. patent application Ser. No. 08/076,656 filed Jun. 11, 1993 and assigned to the assignee hereof. Strut members 216 extend between upper and lower edges of rear wall 14 and bosses 218 along upper and lower edges of forward wall section 202, thus securing forward and rearward wall sections 202,14 together. Interconnection circuitry 206 is disposed therebetween. A first connection region is defined which provides connections between circuits of the interconnection circuitry with terminals of card-associated connectors 204 mounted in forward wall section 202, which mate with corresponding terminals of connectors 102,132 mounted on leading edges 104,134 of daughter cards 100 and matrix card 130 (see FIGS. 2 and 15). A second connection region is defined along rear wall section 14 which provides connections between circuits with terminals of input/output connectors 208 mounted in rear wall 14, which mate with contact sections 358 of corresponding terminals 210 of cable connectors 350 mounted on panel member 310 of rack assembly 300 at the input/output interface.

Figure 14:
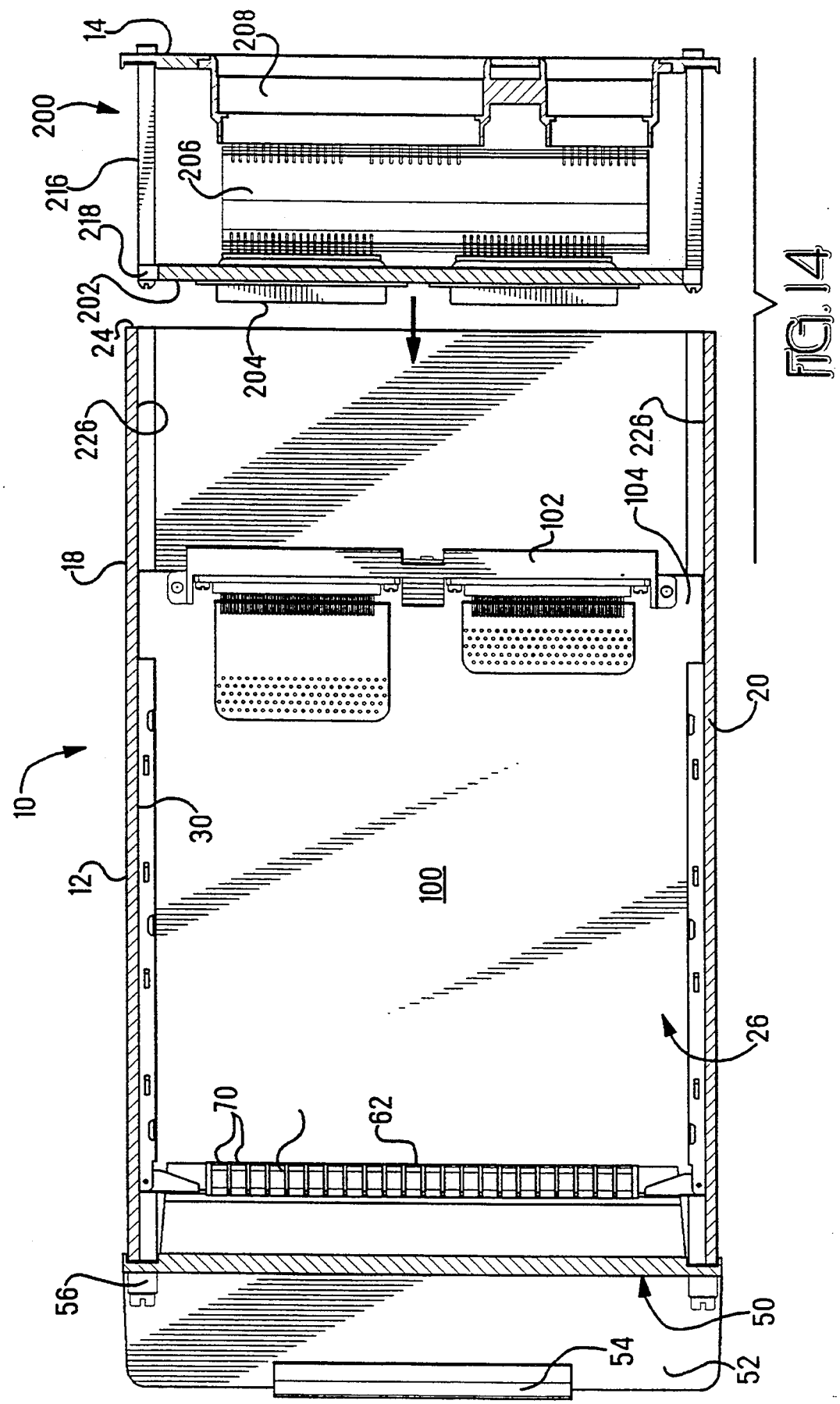
FIG. 14 is a longitudinal section view illustrating the mounting of the backplane assembly of FIGS. 10 and 13 into the junction box of FIGS. 1 and 2 which contains a daughter card positioned therewithin, and the front panel secured in place at the front face of the junction box.

With reference now to FIG. 14, backplane assembly 200 is shown positioned to be inserted into rear face 24 of junction box 10. Forward wall section 202 is dimensioned and shaped so that the peripheral edge thereof just fits within the inner surfaces of top and bottom walls 18,20 (and opposed side walls 16) of body section 12. Rear wall 14 is shaped and dimensioned so that its periphery abuts the rear edges of the four sides of body section 12, for fasteners to secure it to the rear face 24 of the junction box. Struts 216 extend between the periphery of rearward wall section 14 and the tabs 218 of forward wall section 202, are received into pairs of channels 226 in top and bottom walls 18,20 of the junction box 10 extending inwardly from rear face 24, which positions forward wall section 202 laterally for connectors 204 mounted thereto to be aligned with card guides 30 of the card-receiving region 26 forwardly thereof, all so that the wall-mounted connectors 204 are aligned with card-mounted connectors 102,132 upon insertion of the associated daughter card or matrix card.

Figure 15:
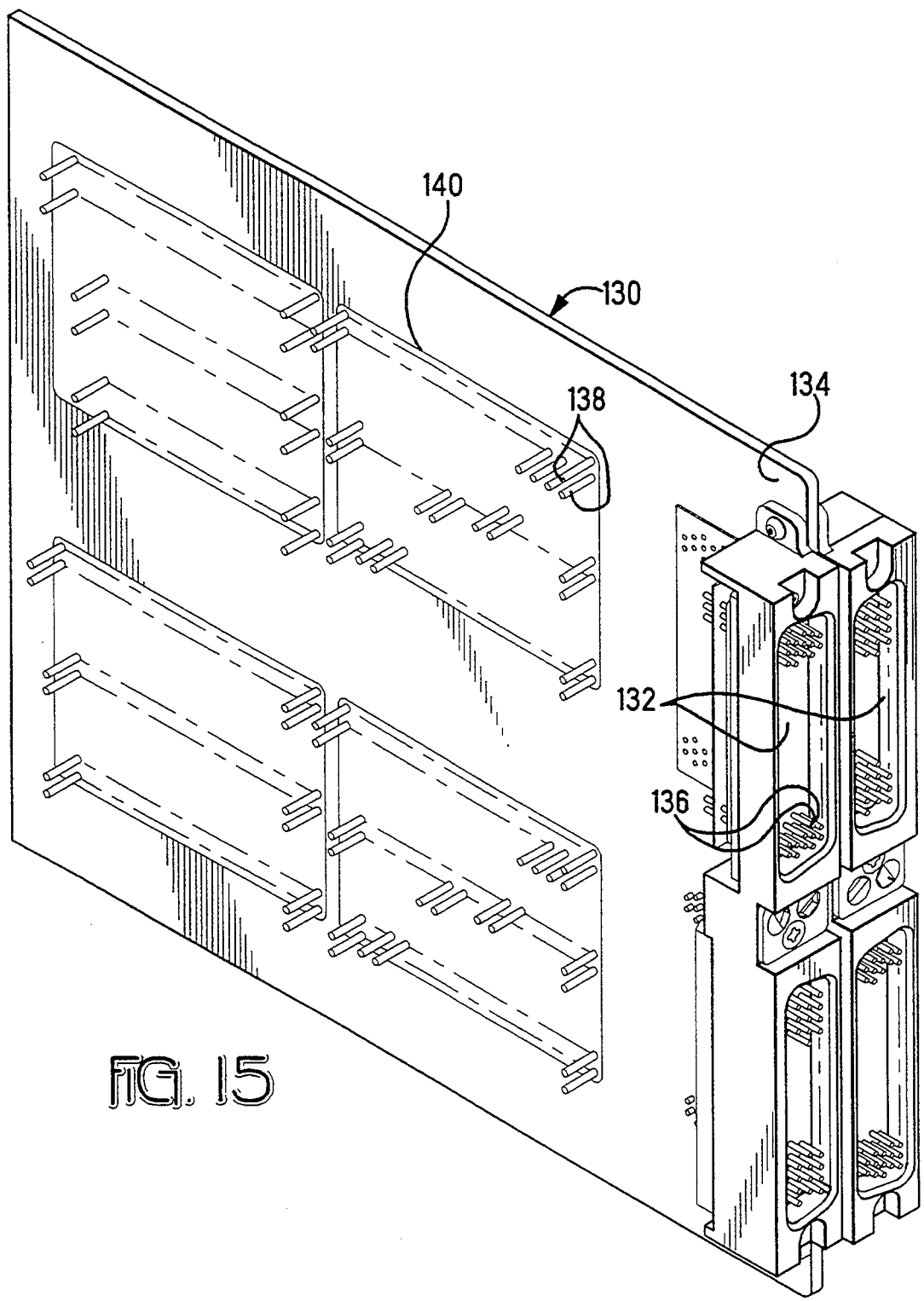
FIG. 15 is an isometric view of a matrix card for use with the backplane assembly of the junction box to integrate the circuits, and showing a pair of integral shell members containing the card-mounted connectors.

The junction box 10 of the present invention, and the backplane assembly 200 used therewith, also are especially useful to define a wire integration system, in which circuits of the daughter cards 100 can be connected as desired to any particular conductor of the input/output interface. Matrix card 130 is disclosed to be insertable into the junction box in the same manner as a daughter card at a particular location, preferably having connectors 132 mounted on both sides of leading edge 134 as shown in FIG. 15. Terminals 136 of the four connectors include contact sections electrically connected to circuits of the matrix card which extend to one or more other card terminals 138 which in turn are connected to other card terminals 138 or directly to other terminals 136 of the four connectors as desired, such as by using flexible film circuit elements 140 as shown, or alternatively by discrete wires wrapped to the card terminals 138 with conventional wire wrapping techniques. The matrix card can thus be easily programmed by utilizing flexible circuits of particular customized circuit design (or discrete wire wrap segments), which can be replaced on the matrix card if necessary.

Backplane assembly 200 accommodates the use of such a programmable circuit integration member as matrix card 130, by directing substantially all circuits of the various flexible circuit elements of the laminar array from input/output terminals 210 only to terminals in a matrix connection region with which the location of matrix card 130 would of course be aligned. From the matrix connection region circuit segments would extend to selected terminals associated with particular daughter cards. Thus backplane assembly 200 may be fabricated to a basic circuit configuration, with matrix card 130 providing customization for particular uses of the junction box 10, and enabling ease of reprogramming, all resulting in simplified construction of the backplane assembly which can easily handle providing circuits for over a thousand of individual terminal interconnections in a compact arrangement, as in the present design.

A spring clip can be mounted to the circuit card at the edge thereof and be matable with a fin edge of framework of a card cage enclosure and establish the thermal junction of the present invention. Other variations and modifications may occur to the separable thermal junction of an enclosure and a circuit card, and to the spring clip enabling formation thereof of the embodiment disclosed herein, which may occur to the artisan, which are within the spirit of the invention and the scope of the claims.

What is claimed is:

1. A junction box for a plurality of electrical interconnections of circuits of circuit cards with electrical conductors extending into the junction box at an input/output interface, comprising:

a body member defining opposed side walls and opposed top and bottom walls extending from a front face to a rear wall, a front panel member securable to said front face to define a front wall traversing a card-receiving opening, and a backplane assembly proximate and affixed to said rear wall and including a transverse interior wall positioned rearwardly of a card-receiving region proximate said front panel, all generally defining a card cage;

said side walls and top wall and bottom wall and rear wall and front panel member being formed of thermally and electrically conductive material of substantial thickness and being substantially free of openings, said side walls and said top and bottom walls adjoined to edges of adjacent ones thereof and said rear wall being adjoined to rear edges of said opposed side walls and said top and bottom walls in a manner to eliminate any gap thereat through which electromagnetic and radiofrequency energy could otherwise pass;

said rear wall including an array of electrical input/output connectors mounted thereon adapted to be mated with complementary electrical connectors and defining an input/output interface, said rear wall including shield sections surrounding respective said input/output connectors in a manner eliminating any gap peripherally therearound through which electromagnetic and radiofrequency energy could otherwise pass, said interior wall including an array of card connectors mounted thereon to mate with corresponding connectors of a plurality of circuit cards insertable into said body member, and one of said opposing side walls or said top and bottom walls including pairs of card guide means extending from front edges thereof to said interior wall and cooperating to guide movement of respective said circuit cards during insertion and removal, with said card connectors aligned with respect to respective said pairs of card guide means to mate with complementary connectors along leading ends of respective said circuit cards during card insertion;

said backplane assembly defining an array of electrical circuits connecting terminals of said card connectors mounted on said interior wall to terminals of said input/output connectors mounted on said rear wall;

said front panel member being securable to said body member to tightly abut front edges of said opposed side walls and said top and bottom walls in a manner to eliminate any gap thereat through which electromagnetic and radiofrequency energy could otherwise pass, and securable in a manner facilitating removal thereof to permit insertion and removal of a said circuit card;

said front panel member including an array of fins extending into said card-receiving region to facilitate absorption of thermal energy therefrom, said fins being associated with respective circuit cards and extending to card-proximate ends adjacent to trailing edges of said cards and having secured therealong respective spring clips each defining an edge-receiving entrance therealong aligned with a said pair of card guide means to become at least thermally connected to substantial length of a said trailing edge of a respective said circuit card inserted along said pair of card guide means, upon securing said front panel member to said front face of said body member, whereby a compact card cage of robust construction is defined adapted to shield said circuit cards and electrical interconnections thereof with said electrical conductors from electromagnetic and radiofrequency interference and to facilitate dissipation of thermal energy therefrom.

2. A junction box as set forth in claim 1 wherein at least one said spring clip is electrically conductive, whereby upon engagement with a shielding layer of an associated said circuit card, a ground path is defined to said front panel grounding said shielding layer.

3. A junction box as set forth in claim 1 wherein each said spring clip includes a mounting section joined to a card-remote portion of a respective said fin, a body section extending from said mounting section and along a surface of said fin parallel and adjacent to a trailing edge portion of a respective said circuit card, and a spring arm section joined to said body section at a bight section forwardly of said trailing edge of said circuit card and extending to a constriction at a card-proximate end of said fin and concluding in a diverging free end to define said edge-receiving entrance, whereby said trailing edge portion of said circuit card is received into said edge-receiving entrance and deflects outwardly said spring arm section under spring bias which establishes an assured engagement of said trailing edge portion with said body section for thermal transmission to said body section and said fin.

4. A junction box as set forth in claim 3 wherein each said spring arm section is defined by an array of discrete spring arms.

5. A front panel for a card cage for traversing a front face thereof to enclose a card-receiving region, comprising:

a member formed of thermally and electrically conductive material of substantial thickness and being securable to a body member of the card cage to tightly abut front edges of opposed side walls and top and bottom walls thereof in a manner to eliminate any gap thereat through which electromagnetic and radiofrequency energy could otherwise pass, and securable in a manner facilitating removal thereof to permit insertion and removal of a circuit card;

said member including an array of fins extending into the card-receiving region to facilitate absorption of thermal energy therefrom, said fins being associated with respective circuit cards and extending to card-proximate ends adjacent to trailing edges of said cards and having secured therealong respective spring clips each defining an edge-receiving entrance therealong to be at least thermally connected to a said trailing edge of a respective said circuit card upon securing said front panel member to said front face of said body member.

6. A front panel as set forth in claim 5 wherein at least one said spring clip is electrically conductive, whereby upon engagement with a shielding layer of an associated said circuit card, a ground path is defined to said front panel grounding said shielding layer.

7. A front panel as set forth in claim 5 wherein each said spring clip includes a mounting section joined to a card-remote portion of a respective said fin, a body section extending from said mounting section and along a surface of said fin parallel and adjacent to a trailing edge portion of a respective said circuit card, and a spring arm section joined to said body section at a bight section forwardly of said trailing edge of said circuit card and extending to a constriction at a card-proximate end of said fin and concluding in a diverging free end to define said card-receiving entrance, whereby said trailing edge portion of said circuit card is received into said edge-receiving entrance and deflects outwardly said spring arm section under spring bias which establishes an assured engagement of said trailing edge portion with said body section for thermal transmission to said body section and said fin.

8. A front panel as set forth in claim 7 wherein each said spring am section is defined by an array of discrete spring arms.

9. A thermal junction of an edge of a circuit card to card cage framework, comprising:

a panel member of the card cage framework securable to a front face thereof traversing a card-receiving opening of a card-receiving region thereof;

a circuit card insertable into said card-receiving region;

a fin section of said panel member associated with and parallel to a trailing edge of said circuit card to be adjacent thereto; and a spring clip secured to one of said trailing edge and an edge of said fin section defining an edge-receiving entrance therealong to be at least thermally connected to the other of said trailing edge of a respective said circuit card and fin section edge upon securing said front panel member to said front face of said body member.

10. A thermal junction as set forth in claim 9 wherein said spring clip is electrically conductive, whereby upon engagement with a shielding layer of an associated said circuit card, a ground path is defined to said front panel grounding said shielding layer.

11. A thermal junction as set forth in claim 9 wherein said spring clip includes a mounting section joined to a card-remote portion of a respective said fin section, a body section extending from said mounting section and along a surface of said fin section parallel and adjacent to a trailing edge portion of a respective said circuit card, and a spring arm section joined to said body section at a bight section forwardly of said trailing edge of said circuit card and extending to a constriction at a card-proximate end of said fin section and concluding in a diverging free end to define said card-receiving entrance, whereby said trailing edge portion of said circuit card is received into said edge-receiving entrance and deflects outwardly said spring arm section under spring bias which establishes an assured engagement of said trailing edge portion with said body section for thermal transmission to said body section and said fin section.

12. A thermal junction as set forth in claim 11 wherein each said spring arm section is defined by an array of discrete spring arms joined by respective bight sections to an integral said body section.

13. A thermal junction as set forth in claim 11 wherein said mounting section extends around said card-proximate end of said fin and along a card-remote side thereof to a securing end section received into a recess behind a forwardly facing ledge held therein by strong spring bias of said mounting section compressing said securing end section toward said fin.

14. A thermal junction as set forth in claim 13 wherein said mounting section is defined by an array of discrete mounting spring arms joined by respective bight sections to an integral said body section.

15. A spring clip for engaging an edge of a circuit card in a card cage, comprising:

a mounting section for mounting to framework of the card cage proximate said edge of said circuit card;

a body section extending from said mounting section to an array of spaced bight sections; and an array of spring arms coextending from respective said spaced bight sections along and converging toward said body section to respective constrictions and then diverging to respective free ends defining an edge-receiving entrance, said mounting section extends to a securing end section extending toward said body section to be received into a recess behind a forwardly facing ledge of a fin of said framework and held therein by strong spring bias of said mounting section compressing said securing end section toward said fin when said mounting section is mounted to said card-proximate fin end and along a card-remote side of said fin.

16. The spring clip of claim 15 wherein said mounting section is defined by discrete spring arm portions extending from respective bight sections joining an integral said body section, and said securing end section is defined by inwardly bent free ends of said discrete spring arm portions each received into said recess.

* * * * *